US012690331B2

(12) United States Patent
Lee et al.

(10) Patent No.: US 12,690,331 B2
(45) Date of Patent: Jul. 21, 2026

(54) DISPLAY SUBSTRATE AND DISPLAY DEVICE

(71) Applicants: Yunnan Invensight Optoelectronics Technology Co., Ltd., Kunming (CN); BOE Technology Group Co., Ltd., Beijing (CN)

(72) Inventors: Yuhao Lee, Beijing (CN); Xue Dong, Beijing (CN); Xiaochuan Chen, Beijing (CN); Hui Tong, Beijing (CN); Xiaobin Shen, Beijing (CN); Kuanta Huang, Beijing (CN); Cao Wu, Beijing (CN); Weiliang Bu, Beijing (CN); Hui Wang, Beijing (CN); Zhiqiang Jiao, Beijing (CN)

(73) Assignees: YUNNAN INVENSIGHT OPTOELECTRONICS TECHNOLOGY CO., LTD., Kunming (CN); BOE TECHNOLOGY GROUP CO., LTD., Beijing (CN)

( * ) Notice: Subject to any disclaimer, the term of this patent is extended or adjusted under 35 U.S.C. 154(b) by 540 days.

(21) Appl. No.: 18/026,365

(22) PCT Filed: May 31, 2022

(86) PCT No.: PCT/CN2022/096228
§ 371 (c)(1),
(2) Date: Mar. 15, 2023

(87) PCT Pub. No.: WO2023/092978
PCT Pub. Date: Jun. 1, 2023

(65) Prior Publication Data
US 2024/0099066 A1 Mar. 21, 2024

(30) Foreign Application Priority Data

Nov. 29, 2021 (WO) ................ PCT/CN2021/133886
Apr. 22, 2022 (WO) ................ PCT/CN2022/088548

(51) Int. Cl.
*H10K 59/122* (2023.01)
*H10K 50/19* (2023.01)
(Continued)

(52) U.S. Cl.
CPC ........... *H10K 59/122* (2023.02); *H10K 50/19* (2023.02); *H10K 59/1201* (2023.02); *H10K 59/80517* (2023.02); *H10K 71/60* (2023.02)

(58) Field of Classification Search
None
See application file for complete search history.

(56) References Cited

U.S. PATENT DOCUMENTS 10,862,064 B1 12/2020 Ting et al.
10,971,551 B2 * 4/2021 Wang ................... H10K 59/122
(Continued)

FOREIGN PATENT DOCUMENTS

CN 102272970 A 12/2011
CN 102916031 A 2/2013
(Continued)

OTHER PUBLICATIONS

Extended European search report of counterpart European application No. 21965268.2 issued on Jul. 5, 2024, 9 pages.
(Continued)

*Primary Examiner* — Michelle Mandala
(74) *Attorney, Agent, or Firm* — XSENSUS LLP

(57) ABSTRACT

Disclosed are a display substrate. The display substrate includes a drive backplane; a first electrode layer disposed on a side of the drive backplane; a pixel definition layer disposed on a side, distal to the drive backplane, of the first electrode layer; an organic light-emitting layer disposed on a side, distal to the drive backplane, of the pixel definition layer, wherein the organic light-emitting layer comprises: a plurality of organic material layers stacked in a direction
(Continued)

A-A' perpendicular to and away from the drive backplane, and a portion of the organic material layer disposed inside the partition groove is separated from a portion of the organic material layer disposed outside the partition groove; and a second electrode layer disposed on a side, distal to the drive backplane, of the organic light-emitting layer.

18 Claims, 7 Drawing Sheets

(51) Int. Cl.

| | |
|---|---|
| *H10K 59/12* | (2023.01) |
| *H10K 59/80* | (2023.01) |
| *H10K 71/60* | (2023.01) |

(56) References Cited

U.S. PATENT DOCUMENTS

| | | | | |
|---|---|---|---|---|
| 12,185,590 | B2 * | 12/2024 | Kinjo | H10K 50/11 |
| 2003/0132703 | A1 | 7/2003 | Sakaguchi | |
| 2010/0252857 | A1 | 10/2010 | Nakatani et al. | |
| 2011/0291086 | A1 | 12/2011 | Nishiyama | |
| 2013/0032803 | A1 | 2/2013 | Moon et al. | |
| 2013/0234120 | A1 | 9/2013 | Kakinuma et al. | |
| 2014/0027731 | A1 | 1/2014 | Kim et al. | |
| 2014/0042400 | A1 | 2/2014 | Kim et al. | |
| 2014/0353595 | A1 | 12/2014 | Choi et al. | |
| 2015/0144906 | A1 | 5/2015 | Ichikawa | |
| 2015/0208480 | A1 | 7/2015 | Hosokawa et al. | |
| 2016/0049613 | A1 | 2/2016 | Kang et al. | |
| 2016/0079325 | A1 | 3/2016 | Lee et al. | |
| 2016/0293888 | A1 | 10/2016 | Shim et al. | |
| 2017/0133620 | A1 | 5/2017 | Lee et al. | |
| 2017/0170243 | A1 * | 6/2017 | An | H10K 59/121 |
| 2018/0180951 | A1 | 6/2018 | Toyotaka | |
| 2019/0097161 | A1 | 3/2019 | Im et al. | |
| 2019/0131365 | A1 | 5/2019 | Jung | |
| 2019/0172898 | A1 | 6/2019 | Choi | |
| 2019/0181199 | A1 | 6/2019 | Choi et al. | |
| 2019/0386090 | A1 | 12/2019 | Chen et al. | |
| 2020/0028122 | A1 | 1/2020 | Hu et al. | |
| 2020/0161393 | A1 | 5/2020 | Huang et al. | |
| 2020/0203469 | A1 | 6/2020 | Li et al. | |
| 2020/0212162 | A1 | 7/2020 | Fan | |
| 2021/0151702 | A1 | 5/2021 | Fan et al. | |
| 2021/0167145 | A1 | 6/2021 | Gong et al. | |
| 2021/0202686 | A1 | 7/2021 | Jeon et al. | |
| 2022/0085330 | A1 | 3/2022 | Yang et al. | |
| 2022/0102663 | A1 | 3/2022 | Wo et al. | |
| 2022/0115469 | A1 | 4/2022 | Huang et al. | |
| 2022/0392968 | A1 | 12/2022 | Liu et al. | |
| 2022/0393132 | A1 | 12/2022 | Nishikawa et al. | |
| 2023/0006011 | A1 | 1/2023 | Li et al. | |
| 2024/0047471 | A1 * | 2/2024 | Huang | H10H 29/10 |

FOREIGN PATENT DOCUMENTS

| | | | |
|---|---|---|---|
| CN | 103311268 | A | 9/2013 |
| CN | 106783924 | A | 5/2017 |
| CN | 107170788 | A | 9/2017 |
| CN | 107425131 | A | 12/2017 |
| CN | 108242459 | A | 7/2018 |
| CN | 109103217 | A | 12/2018 |
| CN | 109119437 | A | 1/2019 |
| CN | 109346505 | A | 2/2019 |
| CN | 109599502 | A | 4/2019 |
| CN | 110299469 | A | 10/2019 |
| CN | 110364555 | A | 10/2019 |
| CN | 110416279 | A | 11/2019 |
| CN | 110416434 | A | 11/2019 |
| CN | 110993806 | A | 4/2020 |
| CN | 111244070 | A | 6/2020 |
| CN | 111564484 | A | 8/2020 |
| CN | 111627976 | A | 9/2020 |
| CN | 111668380 | A | 9/2020 |
| CN | 111722761 | A | 9/2020 |
| CN | 112002827 | A | 11/2020 |
| CN | 112133734 | A | 12/2020 |
| CN | 112151690 | A | 12/2020 |
| CN | 112531125 | A | 3/2021 |
| CN | 113066834 | A | 7/2021 |
| CN | 113130598 | A | 7/2021 |
| CN | 113193151 | A | 7/2021 |
| CN | 113410268 | A | 9/2021 |
| CN | 113659098 | A | 11/2021 |
| CN | 214588861 | U | 11/2021 |
| CN | 214672621 | U | 11/2021 |
| CN | 113964162 | A | 1/2022 |
| CN | 114361222 | A | 4/2022 |
| JP | 2001-060494 | A | 3/2001 |
| JP | 2002-313572 | A | 10/2002 |
| JP | 2008-039843 | A | 2/2008 |
| KR | 2006-0091665 | A | 8/2006 |
| KR | 2008-0061918 | A | 7/2008 |
| KR | 2008-0080974 | A | 9/2008 |
| KR | 2020-0034158 | A | 3/2020 |
| KR | 2020-0082491 | A | 7/2020 |
| WO | 2021/085176 | A1 | 5/2021 |
| WO | 2021/139660 | A1 | 7/2021 |
| WO | 2021/212333 | A1 | 10/2021 |

OTHER PUBLICATIONS

Non-final office Action of U.S. Appl. No. 17/920,626 issued on May 7, 2025, total 19 pages.

International Search Report and Written Opinion mailed on May 9, 2022, in corresponding PCT/CN2021/133886, 15 pages.

International Search Report and Written Opinion mailed on Aug. 9, 2022, in corresponding PCT/CN2022/088548, 17 pages.

International Search Report and Written Opinion mailed on Jan. 17, 2023, in corresponding PCT/CN2022/130372, 18 pages.

Communication pursuant to Article 94(3) EPC of European application No. 21965268.2 issued on Aug. 25, 2025, total 9 pages.

Non-final office Action of U.S. Appl. No. 18/257,593 issued on Dec. 2, 2025, total 75 pages.

Final office Action of U.S. Appl. No. 18/257,593 issued on Mar. 18, 2026, total 47 pages.

* cited by examiner

000

A-A'

A-A'

A-A'

A-A'

A-A'

A-A'

A-A'

B-B'

000

DISPLAY SUBSTRATE AND DISPLAY DEVICE

This application is a U.S. national stage of international application No. PCT/CN2022/096228, which claims priority to the PCT Application No. PCT/CN2022/088548 filed on Apr. 22, 2022, entitled "DISPLAY DEVICE, DISPLAY PANEL, AND MANUFACTURING METHOD THERE-FOR", and the PCT Application No. PCT/CN2021/133886 filed on Nov. 29, 2021, entitled "DISPLAY SUBSTRATE", the disclosures of which are herein incorporated by reference in their entireties.

TECHNICAL FIELD

The present disclosure relates to the field of display technologies, and in particular, relates to a display substrate and a display device.

BACKGROUND OF THE INVENTION

With the development of display technologies, display devices are more and more widely used. Among them, organic light-emitting diode (OLED) display panels have drawn more and more attention.

SUMMARY OF THE INVENTION

The embodiments of the present disclosure provide a display substrate and a display device. The problem that the display panel in the prior art is relatively poor in display effect can be solved. The technical solutions are as follows:

In one aspect, a display substrate is provided, including:

a drive backplane; a first electrode layer disposed on a side of the drive backplane, wherein the first electrode layer is provided with a plurality of first electrodes electrically connected to the drive backplane;

a pixel definition layer disposed on a side, distal to the drive backplane, of the first electrode layer, wherein the pixel definition layer is provided with a plurality of pixel opening holes in one-to-one correspondence with the plurality of first electrodes and a partition groove disposed between adjacent pixel opening holes, and at least a portion of each first electrode is disposed in the pixel opening hole corresponding to the first electrode;

an organic light-emitting layer disposed on a side, distal to the drive backplane, of the pixel definition layer, wherein the organic light-emitting layer includes: a plurality of organic material layers stacked in a direction perpendicular to and away from the drive back-plane, and a portion of the organic material layer disposed inside the partition groove is separated from a portion of the organic material layer disposed outside the partition groove; and a second electrode layer disposed on a side, distal to the drive backplane, of the organic light-emitting layer.

In some embodiments, a recess structure is provided on a sidewall of the partition groove.

In some embodiments, the pixel definition layer includes a first sub-definition layer and a second sub-definition layer stacked in the direction perpendicular to and away from the drive backplane, the partition groove extends through the first sub-definition layer and the second sub-definition layer, and a side, proximal to the partition groove, of the second sub-definition layer protrudes with respect to a side, proximal to the partition groove, of the first sub-definition layer.

In some embodiments, the partition groove includes: a first sub-partition groove disposed in the first sub-definition layer and a second sub-partition groove disposed in the second sub-definition layer;

wherein an orthographic projection of the second sub-partition groove onto the drive backplane falls within an orthographic projection of the first sub-partition groove onto the drive backplane, and an outer boundary of the orthographic projection of the second sub-partition groove onto the drive backplane is not overlapped with an outer boundary of the orthographic projection of the first sub-partition groove onto the drive back-plane.

In some embodiments, a distance between the outer boundary of the orthographic projection of the second sub-partition groove onto the drive backplane and the outer boundary of the orthographic projection of the first sub-partition groove onto the drive backplane ranges from 0.05 µm to 0.1 µm.

In some embodiments, the pixel definition layer further includes: a third sub-definition layer disposed on a side, proximal to the drive backplane, of the first sub-definition layer;

wherein an orthographic projection of the partition groove onto the drive backplane falls within an orthographic projection of the third sub-definition layer onto the drive backplane;

or alternately, the partition groove further includes: a third sub-partition groove disposed in the third sub-definition layer, an orthographic projection of the third sub-partition groove onto the drive backplane falls within the orthographic projection of the first sub-partition groove onto the drive backplane, and an outer boundary of the orthographic projection of the third sub-partition groove onto the drive backplane is not overlapped with the outer boundary of the orthographic projection of the first sub-partition groove onto the drive backplane.

In some embodiments, the first sub-definition layer is made of silicon nitride, and the second sub-definition layer and the third sub-definition layer are both made of silicon oxide.

In some embodiments, in a case that the orthographic projection of the partition groove onto the drive backplane falls within the orthographic projection of the third sub-definition layer onto the drive backplane, the pixel definition layer further includes: a protection layer disposed between the third sub-definition layer and the first sub-definition layer, and the orthographic projection of the partition groove onto the drive backplane falls within an orthographic projection of the protection layer onto the backplane.

In some embodiments, an included angle between a sidewall of the partition groove and a side, proximal to the drive backplane, of the pixel definition layer ranges from 70° to 110°.

In some embodiments, the display substrate further includes an auxiliary support layer, wherein the auxiliary support layer and the first electrode layer are arranged on a same layer and are made of different materials, a thickness of the auxiliary support layer being less than or equal to a thickness of the first electrode layer;

wherein the orthographic projection of the partition groove onto the drive backplane falls within an orthographic projection of the auxiliary support layer onto the drive backplane.

In some embodiments, the auxiliary support layer is provided with a plurality of hollow structures in one-to-one correspondence with the plurality of first electrodes, and outer boundaries of orthographic projections of the hollow structures onto the drive backplane are overlapped with outer boundaries of orthographic projections of the first electrodes onto the drive backplane.

In some embodiments, the thickness of the auxiliary support layer is greater than or equal to half of the thickness of the first electrode layer.

In some embodiments, the partition groove is distributed around a periphery of each pixel opening hole.

In some embodiments, a depth of the partition groove ranges from 70 nm to 140 nm, and a minimum width of the partition groove ranges from 200 nm to 700 nm.

In some embodiments, an included angle between a sidewall of the pixel opening hole and a side, proximal to the drive backplane, of the pixel definition layer ranges from 70° to 90°.

In some embodiments, an orthographic projection of each pixel opening hole onto the drive backplane falls within the orthographic projection of the first electrode corresponding to the pixel opening hole onto the drive backplane.

In some embodiments, a distance between an outer boundary of the orthographic projection of each pixel opening hole onto the drive backplane and an outer boundary of the orthographic projection of the first electrode corresponding to the pixel opening hole onto the drive backplane is greater than or equal to 150 nm.

In some embodiments, a thickness of the organic light-emitting layer is greater than or equal to three times a thickness of the pixel definition layer.

In some embodiments, the display substrate further includes a packaging layer disposed on a side, distal to the drive backplane, of the second electrode layer.

In another aspect, a display device is provided, including: a driver chip and a display substrate, wherein the display substrate is the display panel according to any one of the above embodiments, and the driver chip is configured to apply a control signal to the display substrate.

BRIEF DESCRIPTION OF THE DRAWINGS

For clearer descriptions of the technical solutions according to the embodiments of the present disclosure, the drawings required to be used in the description of the embodiments are briefly introduced below. It is obvious that the drawings in the description below are only some embodiments of the present disclosure, and it is obvious for those skilled in the art that other drawings can be obtained according to the drawings without creative efforts.

DETAILED DESCRIPTION

Figure 1:
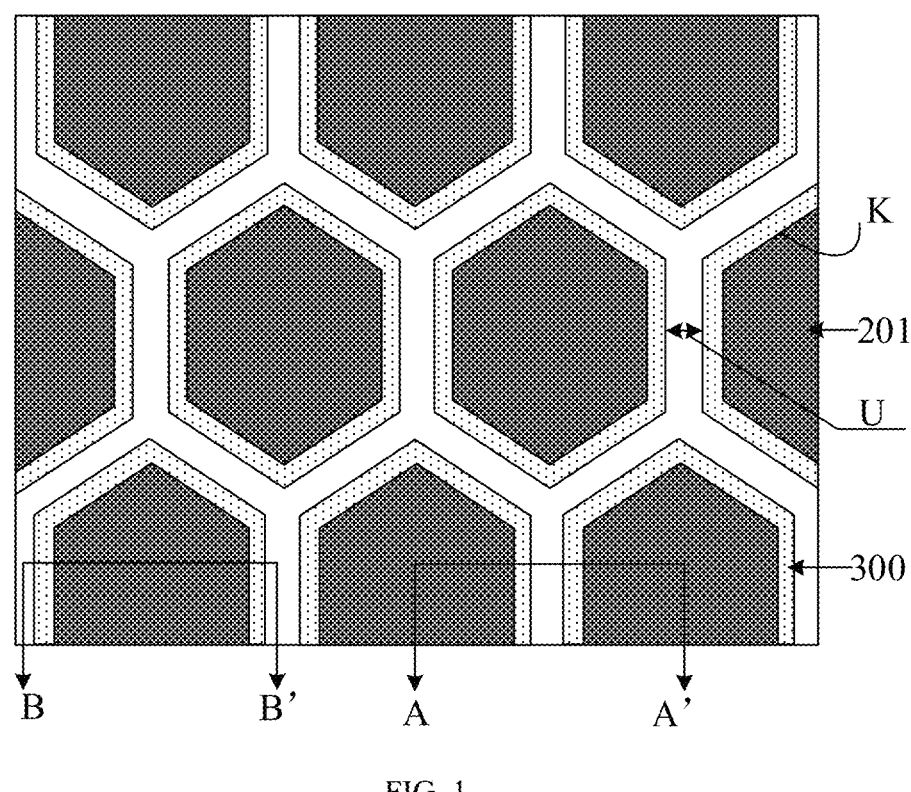
FIG. 1 is a top view of a display substrate according to some embodiments of the present disclosure.

For clearer descriptions of the objects, technical solutions, and advantages of the present disclosure, the embodiments of the present disclosure are further described in detail below with reference to the drawings.

In the related art, a silicon-based OLED display panel includes a drive backplane and a plurality of light-emitting devices disposed on the drive backplane. Each of the light-emitting devices includes: a first electrode, a light-emitting layer, and a second electrode which are sequentially stacked in a direction away from the drive backplane, wherein the first electrodes in the light-emitting devices are all electrically connected to the drive backplane. In this way, in the case that a voltage is applied to the first electrode, an electric field is formed between the first electrode and the second electrode, such that the light-emitting layer disposed between the first electrode and the second electrode generates photons under the action of the electric field to emit light outwards. As such, the OLED display panel can display pictures.

The light-emitting layer is composed of a plurality of sub-light-emitting layers arranged in a stacked manner, and the sub-light-emitting layers are connected to each other in series through charge generation layers. In this way, the color of the light emitted by the light-emitting layer is determined by the plurality of sub-light-emitting layers. In some embodiments, in the case that the light-emitting layer is required to emit white light rays, a sub-light-emitting layer capable of emitting red light rays, a sub-light-emitting layer capable of emitting green light rays, and a sub-light-emitting layer capable of emitting blue light rays are stacked, such that the light-emitting layer emits white light rays. Here, each of the sub-light-emitting layers includes a hole injection layer, a hole transport layer, an emitting material layer, an electron transport layer, and an electron injection layer, which are arranged in a stacked manner. In this way, in the case that a voltage is applied to the first electrode, an electric field is formed between the first electrode and the second electrode, such that electrons and holes are bound to form excitons in a high-energy state. However, the excitons in the high-energy state are unstable and thus are prone to transition into excitons in a low-energy state and releasing energy. Furthermore, photons are generated during the energy release, resulting in the outward emission of light with a wavelength in a certain range. Here, the charge generation layer is generally made of a material with relatively good conductivity, such that each sub-light-emitting layer can emit light rays, and thus the light-emitting effect of the light-emitting layer is relatively good.

However, the light-emitting layer in the OLED display panel is usually formed on a whole layer through evaporation. That is, the sub-light-emitting layers and the charge generation layers in each light-emitting device are integrated. In this way, since the charge generation layers in each light-emitting device are also integrated and the charge generation layers have relatively good conductivity, during the light emission of a certain light-emitting device, the charge generation layers in the light-emitting device may generate a horizontal leakage current. Light-emitting devices adjacent to this light-emitting device may also emit light under the action of the leakage current, which may result in a poor display effect in the OLED display panel.

Figure 2:
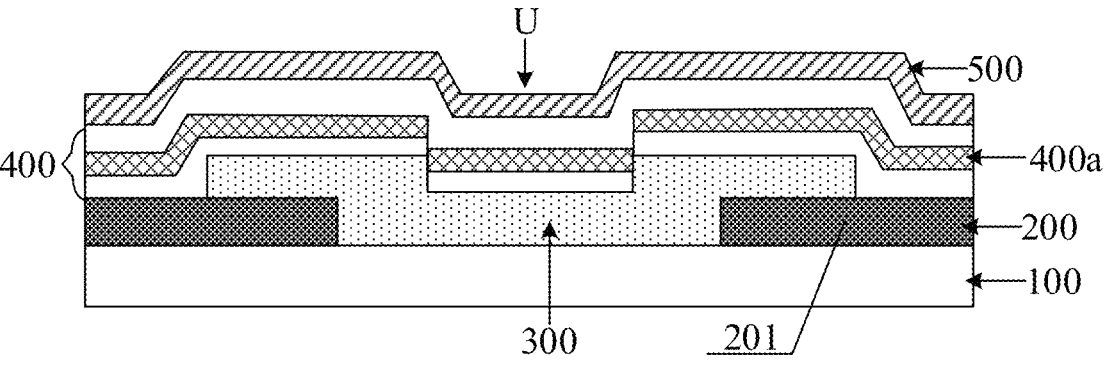
FIG. 2 is a schematic structural diagram of film layers at A-A' shown in FIG. 1.

Referring to FIGS. 1 and 2, FIG. 1 is a top view of a display substrate according to some embodiments of the present disclosure, and FIG. 2 is a schematic structural diagram of film layers at A-A' shown in FIG. 1. The display substrate 000 includes: a drive backplane 100, a first electrode layer 200, a pixel definition layer 300, an organic light-emitting layer 400, and a second electrode layer 500.

The first electrode layer 200 in the display substrate 000 is disposed on a side of the drive backplane 100, and the first electrode layer 200 is provided with a plurality of first electrodes 201 electrically connected to the drive backplane 100.

The pixel definition layer 300 in the display substrate 000 is disposed on a side, distal to the drive backplane 100, of the first electrode layer 200, the pixel definition layer 300 is provided with a plurality of pixel opening holes K in one-to-one correspondence with the plurality of first electrodes 201 and a partition groove U disposed between adjacent pixel opening holes K, and at least a portion of each first electrode 201 is disposed in the corresponding pixel opening hole K corresponding to the first electrode. Here, the portion of the first electrode 201 disposed in the pixel opening hole K, a portion of the organic light-emitting layer 400 disposed in the pixel opening hole K, and a portion of the second electrode layer 500 disposed in the pixel opening hole K constitute a light-emitting device. In some embodiments, the light-emitting device is an OLED light-emitting device.

The organic light-emitting layer 400 in the display substrate 000 is disposed on a side, distal to the drive backplane 100, of the pixel definition layer 300, and the organic light-emitting layer 400 includes a plurality of organic material layers 400a stacked in a direction perpendicular to and away from the drive backplane 100, and a portion of the organic material layers 400a disposed inside the partition groove U is separated from a portion of the organic material layer 400a disposed outside the partition groove U.

The second electrode layer 500 in the display substrate 000 is disposed on a side, distal to the drive backplane 100, of the organic light-emitting layer 400.

According to the present disclosure, since the portion of the organic material layer 400a disposed inside the partition groove U is separated from the portion disposed outside the partition groove U, the organic material layers 400a between any adjacent light-emitting devices are separated by the partition groove U.

In summary, the display substrate according to the embodiments of the present disclosure includes a drive backplane, a first electrode layer, a pixel definition layer, an organic light-emitting layer, and a second electrode layer, wherein a partition groove is provided in the pixel definition layer. Since the portion of the organic material layer disposed inside the partition groove is separated from the portion of the organic material layer disposed outside the partition groove, the organic material layers between any adjacent light-emitting devices are separated by the partition groove. In this way, in the case that a voltage is applied to the first electrode, an electric field is formed between the first electrode and the second electrode layer, such that the leakage current generated by part of the organic material layers in each light-emitting device is separated by the partition groove. That is, the leakage current generated by the organic material layers in the light-emitting device is not horizontally directed to the organic material layer adjacent to this light-emitting device, and then the light emission of this light-emitting device does not affect the light emission of adjacent light-emitting devices. Thus, the better display effect in the display substrate can be ensured.

Figure 3:
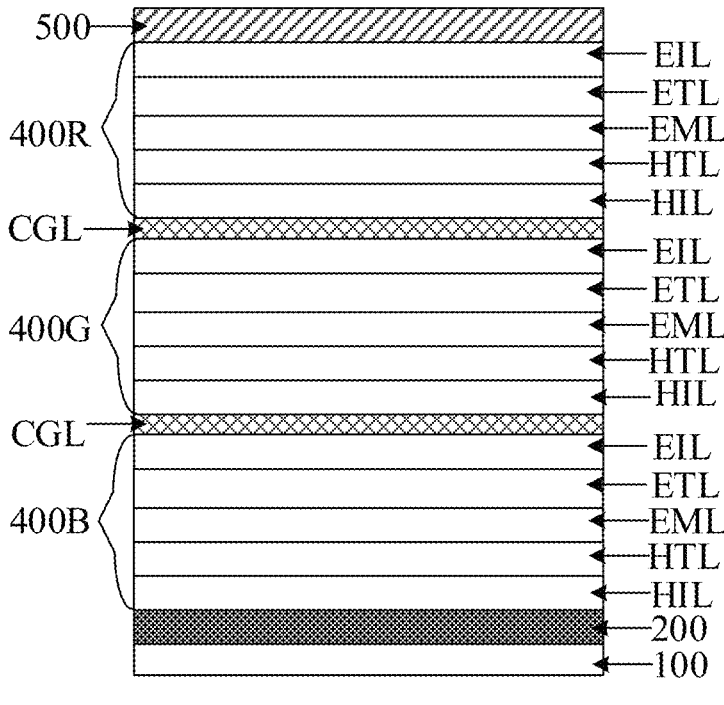
FIG. 3 is a schematic structural diagram of film layers of a light-emitting device according to some embodiments of the present disclosure.

In the present disclosure, as shown in FIG. 3, FIG. 3 is a schematic structural diagram of film layers of a light-emitting device according to some embodiments of the present disclosure. Each organic material layer 400a in the organic light-emitting layer 400 is any one of a hole injection layer HIL, a hole transport layer HTL, an emitting material layer EML, an electron transport layer ETL, an electron injection layer EIL, and a charge generation layer CGL. The hole injection layer HIL, the hole transport layer HTL, the emitting material layer EML, the electron transport layer ETL, and the electron injection layer EIL, which are stacked on a side distal to the drive backplane 100 constitute one sub-light-emitting layer. It should be noted that the organic light-emitting layer 400 in the display substrate according to the embodiments of the present disclosure including a plurality of sub-light-emitting layers is provided for illustrative purposes, and exemplarily, the plurality of sub-light-emitting layers included in the organic light-emitting layer 400 are a sub-red light-emitting layer 400R, a sub-green light-emitting layer 400G, and a sub-blue light-emitting layer 400B.

In this case, any adjacent sub-light-emitting layers in the organic light-emitting layer 400 are connected to each other through the charge generation layer CGL. In this way, in the display substrate 000, the sub-light-emitting layers are connected in series in a direction away from the drive backplane 100 through the charge generation layers CGLs. Thus, in the case that a voltage is applied to the first electrode layer 200, an electric field is formed between the first electrode layer 200 and the second electrode layer 500, and the sub-light-emitting layers in the organic light-emitting layer 400 can emit light, which is mixed into white light and then emitted outwards. Here, since the charge generation layer CGL is generally made of a material with good conductivity, the horizontal leakage current generated by the charge generation layer CGL is greater during the light emission of the light-emitting device, and each organic material layer 400a in the organic light-emitting layer 400 is formed through an evaporation process. Therefore, the charge generation layer CGL is required to be partitioned by the partition groove U in the pixel definition layer 300. In some embodiments, a portion of the charge generation layer CGL disposed inside the partition groove U is separated from a portion disposed outside the partition groove U. In this way, during the light emission of a certain light-emitting device, the horizontal leakage current generated by the charge generation layers CGLs is not directed to the light-emitting devices adjacent to this light-emitting device, such that the probability of crosstalk between any adjacent light-emitting devices is reduced, thus ensuring good display effect in the display substrate.

It should be further noted that, the partition groove U partitions not only the charge generation layer CGL but also other organic light-emitting layers. In some embodiments, the partition groove U partitions at least one of the hole injection layer HIL, the hole transport layer HTL, the emitting material layer EML, the electron transport layer ETL, and the electron injection layer EIL. In this way, the probability of crosstalk between any adjacent light-emitting devices is further reduced.

In the present disclosure, there are multiple implementations for the structure of the pixel definition layer 300, and the embodiments of the present disclosure only take the following two optional implementations as examples for illustrative description.

Figure 4:
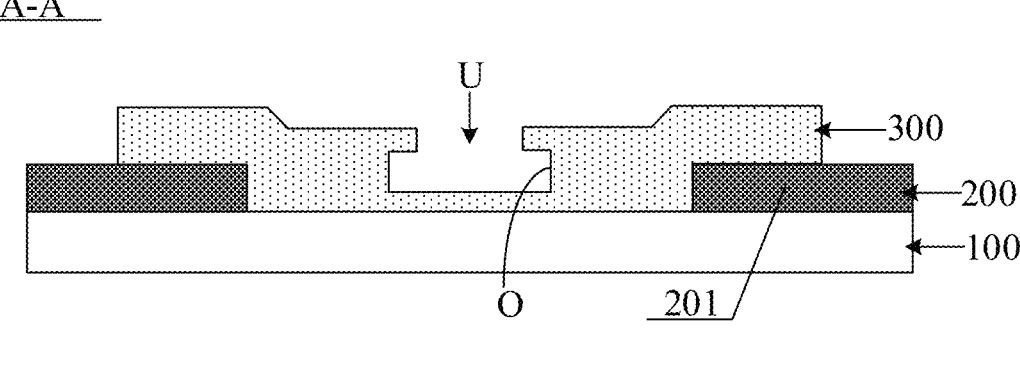
FIG. 4 is a schematic structural diagram of a pixel definition layer according to some embodiments of the present disclosure.

In the first optional implementation, referring to FIG. 4, FIG. 4 is a schematic structural diagram of a pixel definition layer according to some embodiments of the present disclosure. A recess structure O is provided on a sidewall of the partition groove U in the pixel definition layer 300. In this way, in the process of forming the organic material layer 400a of the display substrate 000 by evaporation, a portion of the organic material layer 400a deposited inside the partition groove U is disposed in the recess structure O, and a portion of the organic material layer 400a deposited outside the partition groove U is disposed on the pixel definition layer 300. Thus, since the recess structure O is provided on the sidewall of the partition groove U, the organic material layer 400a deposited in the recess structure O is separated from the organic material layer 400a deposited on the pixel definition layer 300 at the sidewall of the partition groove U. That is, the portion of the organic material layer 400a disposed inside the partition groove U is separated from the portion disposed outside the partition groove U.

Figure 5:
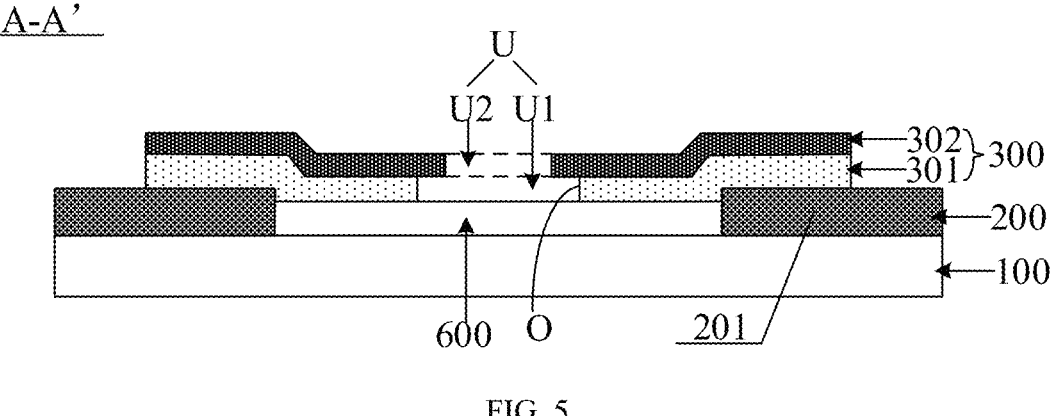
FIG. 5 is a schematic structural diagram of another pixel definition layer according to some embodiments of the present disclosure.

In the embodiments of the present disclosure, referring to FIG. 5, FIG. 5 is a schematic structural diagram of another pixel definition layer according to some embodiments of the present disclosure. The pixel definition layer 300 includes a first sub-definition layer 301 and a second sub-definition layer 302 stacked in a direction perpendicular to and distal to the driver substrate, wherein the partition groove U extends through the first sub-definition layer 301 and the second sub-definition layer 302. A side, proximal to the partition groove U, of the second sub-definition layer 302 protrudes with respect to a side, proximal to the partition groove U, of the first sub-definition layer 301. Thus, a portion of the second sub-definition layer 302 protruding with respect to the first sub-definition layer 301 forms the recess structure O with a side surface of the first sub-definition layer 301 and the drive backplane 100. Here, in order to ensure that the recess structure O can be formed in the pixel definition layer 300, the first sub-definition layer 301 and the second sub-definition layer 302 are made of different materials. In this way, in the display substrate 000, the recess structure O is formed in the pixel definition layer 300 based on the difference in the etching rate of an etchant in the first sub-definition layer 301 and the second sub-definition layer 302. Exemplarily, the first sub-definition layer 301 is made of a silicon nitride material, and the second sub-definition layer 302 is made of a silicon oxide material.

In the present disclosure, the partition groove U in the pixel definition layer 300 includes: a first sub-partition groove U1 disposed in the first sub-definition layer 301 and a second sub-partition groove U2 disposed in the second sub-definition layer 302.

An orthographic projection of the second sub-partition groove U2 onto the drive backplane 100 falls within an orthographic projection of the first sub-partition groove U1 onto the drive backplane 100, and an outer boundary of the orthographic projection of the second sub-partition groove U2 onto the drive backplane 100 is not overlapped with an outer boundary of the orthographic projection of the first sub-partition groove U1 onto the drive backplane 100. In this way, the second sub-partition groove U2 in the second sub-definition layer 302 protrudes with respect to the first sub-partition groove U1 in the first sub-definition layer 301, thereby forming the recess structure O in the partition groove U.

In the embodiments of the present disclosure, the distance between the outer boundary of the orthographic projection of the second sub-partition groove U2 onto the drive backplane 100 and the outer boundary of the orthographic projection of the first sub-partition groove U1 onto the drive backplane 100 ranges from 0.05 μm to 0.1 μm. In this way, after the first sub-partition groove U1 and the second sub-partition groove U2 are formed by etching, the portion of the second sub-partition groove U2 protruding with respect to the first sub-partition groove U1 is relatively small, such that the portion, proximal to the second sub-partition groove U2, of the pixel definition layer 300 in the second sub-definition layer 302 does not collapse. Thus, it is effectively ensured that at least part of the organic material light-emitting layers 400a in the organic light-emitting layer 400 deposited on the pixel definition layer 300 is separated by the partition groove while the structure of the partition groove U is stable.

Figure 6:
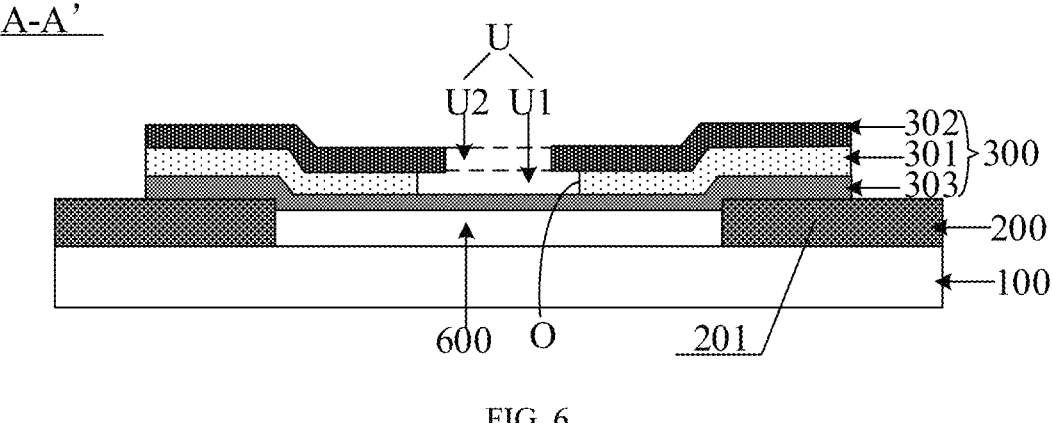
FIG. 6 is a schematic structural diagram of film layers of a pixel definition layer according to some embodiments of the present disclosure.

In the present disclosure, referring to FIG. 6, FIG. 6 is a schematic structural diagram of film layers of a pixel definition layer according to some embodiments of the present disclosure. The pixel definition layer 300 further includes a third sub-definition layer 303 disposed on a side, proximal to the drive backplane 100, of the first sub-definition layer 301. It should be noted that, there are multiple cases for the structure of the pixel definition layer 300, and the embodiments of the present disclosure take the following two cases as examples for illustrative description:

In the first case, as shown in FIG. 6, the orthographic projection of the partition groove U in the pixel definition layer 300 onto the drive backplane 100 is disposed within the orthographic projection of the third sub-definition layer 303 onto the drive backplane 100. In this way, it can be ensured that the depth of the partition groove U is smaller on the premise that the partition groove U partitions the organic material layers 400a, thereby ensuring that a relatively flat second electrode layer 500 as formed subsequently. In this way, in the case that an electric field is formed between the first electrode 201 and the second electrode layer 500, the probability of the longitudinal leakage of electricity between the flat second electrode layer 500 and the first electrode 201 is lower.

Figures 7, 8:
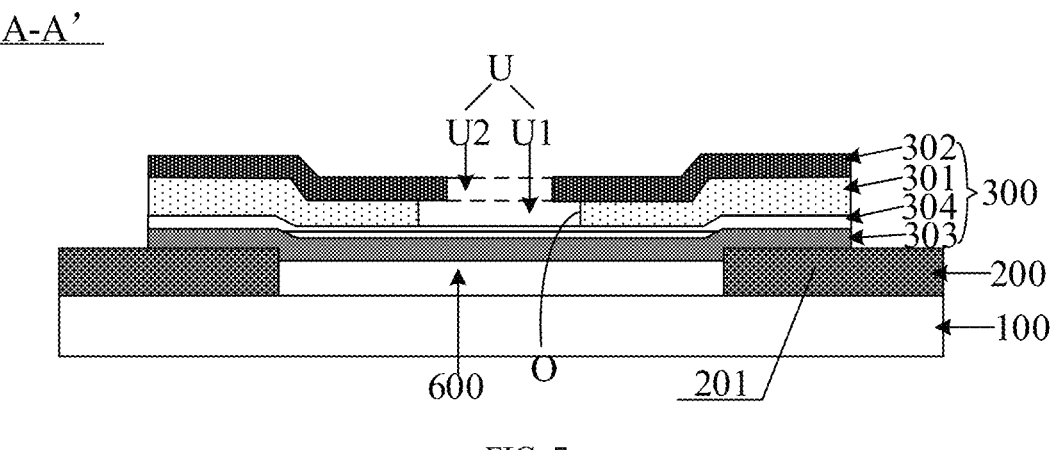
FIG. 7 is a schematic structural diagram of film layers of another pixel definition layer according to some embodiments of the present disclosure.
FIG. 8 is a physical map of a display substrate according to some embodiments of the present disclosure.

In the present disclosure, referring to FIG. 7, FIG. 7 is a schematic structural diagram of film layers of another pixel definition layer according to some embodiments of the present disclosure. In the case that the orthographic projection of the partition groove U onto the drive backplane 100 is disposed within the orthographic projection of the third sub-definition layer 303 onto the drive backplane 100, the pixel definition layer 300 further includes: a protection layer 304 disposed between the third sub-definition layer 303 and the first sub-definition layer 301, wherein the orthogonal projection of the partition groove U onto the drive backplane 100 falls within the orthogonal projection of the protection layer 304 onto the backplane. Here, the protection layer 304 in the pixel definition layer 300 is made of aluminum oxide material. In this way, in the case that the first sub-definition layer 301 is etched by an etchant, the third sub-definition layer 303 is protected by the protection layer 304, so as to prevent the third sub-definition layer 303 from also being etched by the etchant. Therefore, although the etchant etches the first sub-definition layer 301 for a relatively long period of time, the etchant does not etch the third sub-definition layer 303, so as to ensure that there is no groove communicated with the partition groove U in the third sub-definition layer 303.

In this case, referring to FIG. 8, FIG. 8 is a physical map of a display substrate according to some embodiments of the present disclosure. After the organic light-emitting layer 400 and the second electrode layer 500 are subsequently formed on the pixel definition layer 300, a portion of the second electrode layer 500 corresponding to the partition groove U in the display substrate 000 is relatively flat.

Figure 9:
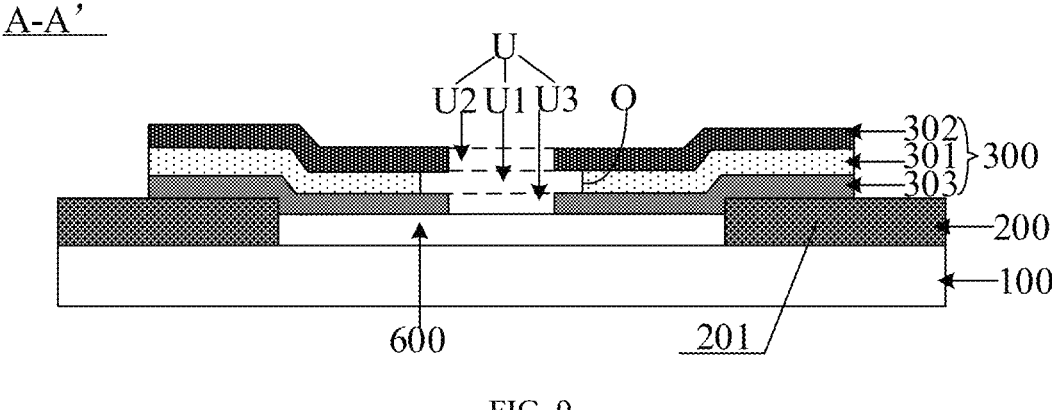
FIG. 9 is a schematic structural diagram of film layers of still another pixel definition layer according to some embodiments of the present disclosure.

In the second case, referring to FIG. 9, FIG. 9 is a schematic structural diagram of film layers of still another pixel definition layer according to some embodiments of the present disclosure. The partition groove U in the pixel definition layer 300 further includes: a third sub-partition groove U3 disposed in the third sub-definition layer 303, wherein an orthographic projection of the third sub-partition groove U3 onto the drive backplane 100 falls within the orthographic projection of the first sub-partition groove U1 on the drive backplane 100, and an outer boundary of the orthographic projection of the third sub-partition groove U3 onto the drive backplane 100 is not overlapped with the outer boundary of the orthographic projection of the first sub-partition groove U1 onto the drive backplane 100. In this way, since the third sub-partition groove U3 is provided in the partition groove U, the partition groove U accommodates more organic material layers 400a, such that the partition groove U is more effective in partitioning the portions of the organic light-emitting layer 400 corresponding to any adjacent light-emitting devices.

It should be noted that, as shown in FIG. 9, the outer boundary of the orthographic projection of the third sub-partition groove U3 onto the drive backplane 100 is overlapped completely with the outer boundary of the orthographic projection of the second sub-partition groove U2 onto the drive backplane 100. In other possible implementations, the outer boundary of the orthographic projection of the third sub-partition groove U3 onto the drive backplane 100 is at least partially not overlapped with the outer boundary of the orthographic projection of the second sub-partition groove U2 onto the drive backplane 100. However, it is necessary to ensure that the orthographic projection of the third sub-partition groove U3 onto the drive backplane 100 falls within the orthographic projection of the second sub-partition groove U2 onto the drive backplane 100, or that the orthographic projection of the second sub-partition groove U2 onto the drive backplane 100 falls within the orthographic projection of the third sub-partition groove U3 onto the drive backplane 100, which is not limited in the embodiments of the present disclosure.

In the embodiments of the present disclosure, the first sub-definition layer 301 in the pixel definition layer 300 is made of silicon nitride, and the second sub-definition layer 302 and the third sub-definition layer 303 are made of silicon oxide. In this way, in the display substrate 000, the recess structure O is formed in the pixel definition layer 300 based on the difference in the etching rate of an etchant in silicon nitride and silicon oxide. Exemplarily, as shown in FIG. 5, in the case that the etching rate of the etchant is higher in silicon nitride and lower in silicon oxide, the first sub-definition layer 301 is easily etched while the second sub-definition layer 302 is not, such that a side, proximal to the partition groove U, of the second sub-definition layer 302 protrudes with respect to a side, proximal to the partition groove U, of the first sub-definition layer 301, thus forming the recess structure O in the pixel definition layer 300.

Figure 10:
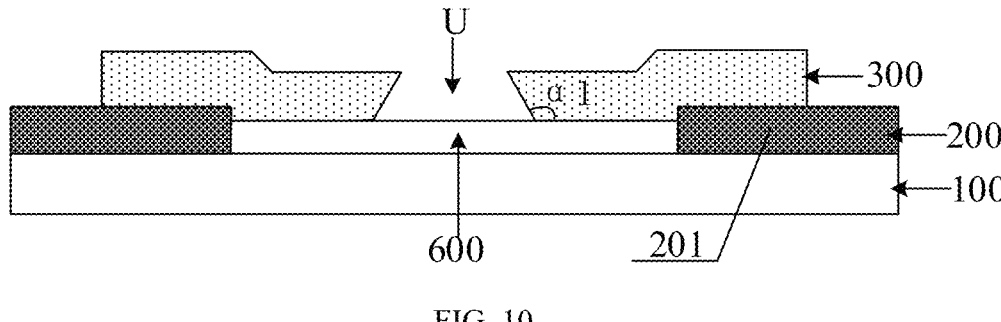
FIG. 10 is a schematic structural diagram of yet still another pixel definition layer according to some embodiments of the present disclosure.

In the second optional implementation, referring to FIG. 10, FIG. 10 is a schematic structural diagram of yet still another pixel definition layer according to some embodiments of the present disclosure. An included angle α1 between the sidewall of the partition groove U in the pixel definition layer 300 and the side, proximal to the drive backplane 100, of the pixel definition layer 300 ranges from 70° to 110°. Here, FIG. 10 shows a case where the included angle α1 between the sidewall of the partition groove U and the side, proximal to the drive backplane 100, of the pixel definition layer 300 is an obtuse angle.

In the embodiments of the present disclosure, in the case that the included angle α1 between the sidewall of the partition groove U in the pixel definition layer 300 and the side, proximal to the drive backplane 100, of the pixel definition layer 300 is 70° to 90°, the slope of the included angle between the sidewall of the partition groove U and the side, proximal to the drive backplane 100, of the pixel definition layer 300 is relatively large, such that the film layers of the organic material layers 400a on both sides of the sidewall of the partition groove U are distributed in a staggered manner. That is, the organic material layers 400a are separated by the partition groove U. In this way, crosstalk does not occur between the portions of the organic light-emitting layer 400 corresponding to any adjacent light-emitting devices. In the case that the included angle α1 between the sidewall of the partition groove U in the pixel definition layer 300 and the side, proximal to the drive backplane 100, of the pixel definition layer 300 is 90° to 110°, the width of the side, proximal to the drive backplane 100, of the partition groove U is greater, and the width of the side, distal to the drive backplane 100, of the partition groove U is smaller, such that the organic material layers 400a on both sides of the sidewall of the partition groove U are more effectively separated by the partition groove U. In this way, the probability of crosstalk between the portions of the organic light-emitting layer 400 corresponding to any adjacent light-emitting devices is lower.

For the two optional implementations described above, as shown in FIGS. 5, 6, 7, 9, and 10, the display substrate 000 further includes: an auxiliary support layer 600 arranged on the same layer as the first electrode layer 200, the auxiliary support layer 600 is made of a different material, and the thickness of the auxiliary support layer 600 is less than or equal to the thickness of the first electrode layer 200. Here, as shown in FIGS. 5, 6, 7, 9, and 10, the thickness of the auxiliary support layer 600 is less than that of the first electrode layer 200. In other possible implementations, the thickness of the auxiliary support layer 600 is also equal to that of the first electrode layer 200, which is not limited in the embodiments of the present disclosure.

The orthographic projection of the partition groove U onto the drive backplane 100 falls within the orthographic projection of the auxiliary support layer 600 onto the drive backplane 100. In this way, the auxiliary support layer 600 enables the partition groove U to be higher than the first electrode layer 200. Thus, although the partition groove U is formed in the area between the two first electrodes 201, it does not result in a relatively large slope of the portion of the second electrode layer 500 disposed in the area where the partition groove U is disposed, such that the overall slope of the second electrode layer 500 is relatively mild, and thus the second electrode layer 500 is relatively flat. In this way, in the case that an electric field is formed between the first electrode 201 and the second electrode layer 500, the second electrode layer 500 is relatively flat, such that the second electrode layer 500 and the first electrode 201 are not prone to longitudinal leakage of electricity.

In the embodiments of the present disclosure, the auxiliary support layer 600 is provided with a plurality of hollow structures in one-to-one correspondence with the plurality of first electrodes 201, wherein outer boundaries of orthographic projections of the hollow structures onto the drive backplane 100 is overlapped with outer boundaries of orthographic projections of the first electrodes 201 onto the drive backplane 100. Here, the hollow structure between any two first electrodes 201 is in contact with the first electrodes 201. In this way, the area between any two first electrodes 201 is filled with the auxiliary support layer 600, which may further improve the flatness of the second electrode layer 500.

In the present disclosure, the thickness of the auxiliary support layer 600 is greater than or equal to half of that of the first electrode layer 200. In this way, after the pixel definition layer 300 described above is formed on the auxiliary support layer 600, a portion, proximal to the partition groove U, of the pixel definition layer 300 disposed at the first electrode 201 is relatively flat. Thus, since the portion, proximal to the partition groove U, of the pixel definition layer 300 disposed at the first electrode 201 is relatively flat, after the organic light-emitting layer 400 and the second electrode layer 500 are subsequently formed on the pixel definition layer 300, a portion of the second electrode layer 500 corresponding to the portion, proximal to the partition groove U, of the pixel definition layer 300 disposed at the first electrode 201 does not have a relatively sharp slope. That is, the portion of the second electrode layer 500 is relatively flat.

In the embodiments of the present disclosure, as shown in FIG. 1, the partition groove U in the pixel definition layer 300 is distributed around a periphery of each pixel opening hole K. Here, one pixel opening hole K corresponds to one light-emitting device. The partition groove U in the pixel definition layer 300 partitions the organic material layers 400a in the light-emitting devices in the display substrate 000, such that crosstalk does not occur in the light-emitting devices in the display substrate 000.

In the present disclosure, as shown in FIG. 8, a depth H1 of the partition groove U in the pixel definition layer 300 ranges from 70 nm to 140 nm, and a minimum width D1 of the partition groove U ranges from 200 nm to 700 nm. Here, the depth H1 of the partition groove U is less than or equal to the thickness of the pixel definition layer 300. Thus, it can be ensured that the partition groove U effectively partitions the organic material layers 400a.

Figure 11:
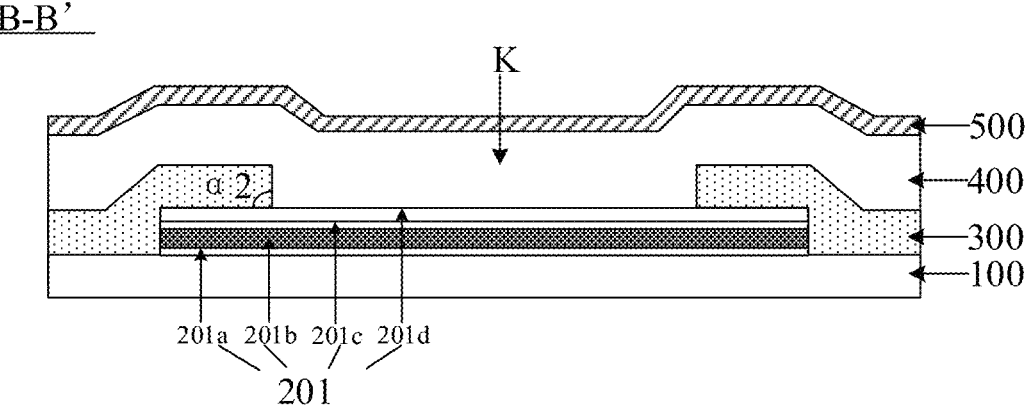
FIG. 11 is a schematic diagram of a cross profile at B-B' shown in FIG. 1.

In the embodiments of the present disclosure, referring to FIG. 11, FIG. 11 is a schematic diagram of a cross profile at B-B' shown in FIG. 1. An included angle $\alpha2$ between the sidewall of the pixel opening hole K and the side, proximal to the drive backplane 100, of the pixel definition layer 300 ranges from 70° to 90°. Here, since the included angle $\alpha2$ between the sidewall of the pixel opening hole K and the side, proximal to the drive backplane 100, of the pixel definition layer 300 is relatively greater, at least part of the organic material layers 400a in the organic light-emitting layer 400 formed at the sidewall of the pixel opening hole K are also separated. That is, the organic material layers 400a corresponding to a portion of the area disposed in the pixel opening hole K are separated from the organic material layers 400a corresponding to a portion, distal to the outside of the pixel opening hole K, of the area disposed on the sidewall of the pixel opening hole K. Thus, it is ensured that the active light-emitting area of each of the light-emitting devices is equal to the area of the orthographic projection of the pixel opening hole K where the light-emitting device is disposed onto the drive backplane 100, thereby ensuring that the active light-emitting area of each light-emitting device is controllable, thus further improving the display effect of the display substrate.

It should be noted that, here, through the included angle $\alpha2$ between the sidewall of the pixel opening hole K and the side, proximal to the drive backplane 100, of the pixel definition layer 300, as well as the partition groove U in the above embodiments, the display substrate 000 further ensures that no horizontal leakage current occurs in the organic material layers 400a between any adjacent light-emitting devices.

In the embodiments of the present disclosure, each of the plurality of second electrodes 201 in the second electrode layer 200 is composed of a first sub-electrode 201a, a second sub-electrode 201b, a third sub-electrode 201c, and a fourth sub-electrode 201d, which are sequentially stacked in a direction away from the drive backplane 100. The first sub-electrode 201a and the third sub-electrode 201c are made of at least one of titanium and titanium nitride, the second sub-electrode 201b is made of aluminum, and the fourth sub-electrode 201d is made of indium tin oxide (ITO). Here, as shown in FIG. 11, an outer boundary of an orthographic projection of the fourth sub-electrode 201d onto the drive backplane 100 is overlapped with outer boundaries of orthographic projections of the first sub-electrode 201a, the second sub-electrode 201b, and the third sub-electrode 201c onto the drive backplane 100. In other possible implementations, the orthographic projections of the first sub-electrode 201a, the second sub-electrode 201b, and the third sub-electrode 201c onto the drive backplane 100 fall within the orthographic projection of the fourth sub-electrode 201d onto the drive backplane 100, such that the fourth sub-electrode 201d covers the sidewalls of the first sub-electrode 201a, the second sub-electrode 201b, and the third sub-electrode 201c, which is not limited in the embodiments of the present disclosure.

It should be noted that, in order to ensure that the light emitted by the light-emitting device passes through the second electrode layer 500, the second electrode layer 500 is made of at least one of transparent conductive material and semi-transparent conductive material. In some embodiments, the second electrode layer 500 is made of indium zinc oxide (IZO).

Figure 12:
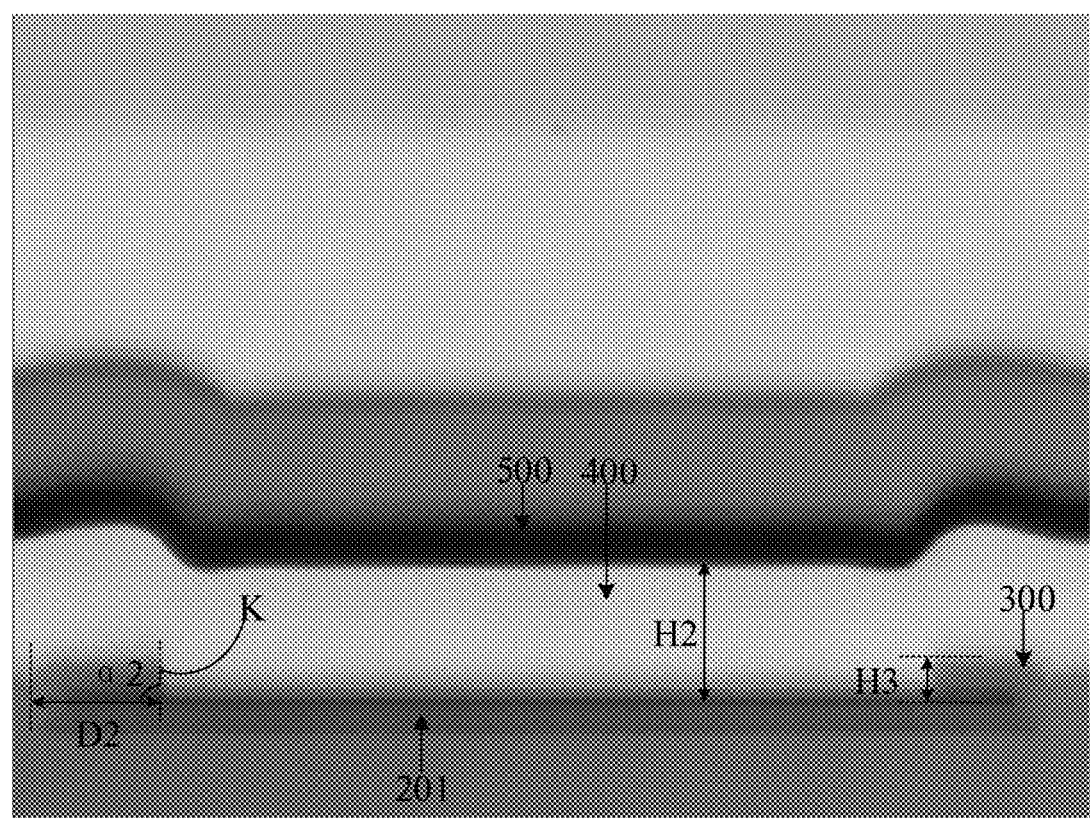
FIG. 12 is a physical map of FIG. 11.

In the present disclosure, referring to FIG. 12, FIG. 12 is a physical map of FIG. 11. The orthographic projection of the pixel opening hole K in the pixel definition layer 300 onto the drive backplane 100 falls within the orthographic projection of the corresponding first electrode 201 onto the drive backplane 100. That is, the pixel definition layer 300 covers an edge portion of the first electrode 201. Here, typically, in the process of forming the patterned first electrode layer 200 on the drive backplane 100, the sidewall of the first electrode 201 has defects such as burrs or recesses. In this way, the portion of the pixel definition layer 300 covering the edge of the first electrode 201 protects the first electrode 201 on the side, proximal to the partition groove U, of the first electrode 201. Thus, after a voltage is applied to the first electrode 201 and the second electrode layer 500, the portion of the pixel definition layer 300 covering the edge of the first electrode 201 effectively prevents the light-emitting device in the display substrate 000 from being broken down due to a corona discharge between the first electrode 201 having burrs and the second electrode layer 500.

In the embodiments of the present disclosure, as shown in FIGS. 8 and 12, a distance D2 between an outer boundary of the orthographic projection of each pixel opening hole K in the pixel definition layer 300 onto the drive backplane 100 and an outer boundary of the orthographic projection of the first electrode 201 corresponding to the pixel opening hole K onto the drive backplane 100 is greater than or equal to 150 nm. Here, since the partition groove U is provided in the pixel definition layer 300, the topography of a portion of the second electrode layer 500 corresponding to the partition groove U is relatively poor, and the portion of the second electrode layer 500 has a relatively large slope angle (as shown in FIG. 8). In this case, in order to avoid a breakdown of the light-emitting device in the display substrate 000 caused by a corona discharge between the second electrode layer 500 and the first electrode 201 due to the relatively poor topography of the second electrode layer 500, in the present disclosure, the display substrate 000 needs to have the pixel definition layer 300 cover the edge of the first electrode 201 by at least 150 nm, such that the portion of the first electrode 201 in the pixel opening hole K is relatively far away from the second electrode layer 500. Thus, the probability of a breakdown of the light-emitting device in the display substrate 000 caused by a corona discharge between the second electrode layer 500 and the first electrode 201 is effectively reduced.

In the present disclosure, the thickness H2 of the organic light-emitting layer 400 is greater than or equal to three times the thickness H3 of the pixel definition layer 300. In this way, the side, distal to the drive backplane 100, of the organic light-emitting layer 400 formed on the pixel definition layer 300 is relatively flat, such that the second electrode layer 500 formed subsequently on the organic light-emitting layer 400 is also relatively flat. Thus, the probability of the longitudinal leakage of electricity between the second electrode layer 500 and the first electrode 201 is relatively low. In some embodiments, as shown in FIG. 12, after the organic light-emitting layer 400 is formed on the portion of the pixel definition layer 300 covering the edge of the first electrode 201, the portion of the organic light-emitting layer 400 is relatively flat, such that the second electrode layer 500 corresponding to the portion of the organic light-emitting layer 400 is also relatively flat. Furthermore, since the thickness H2 of the organic light-emitting layer 400 and the thickness H3 of the pixel definition layer 300 are both relatively large, the second electrode layer 500 is relatively far away from the first electrode 201 at the position of the pixel definition layer 300 covering the edge of the first electrode 201. In this way, the probability of the longitudinal leakage of electricity between the second electrode layer 500 and the first electrode 201 is also relatively low.

It should be noted that the thickness H2 of the organic light-emitting layer 400 ranges from 250 nm to 450 nm, and the thickness H3 of the pixel definition layer 300 ranges from 70 nm to 140 nm. In some embodiments, in the case that the thickness H3 of the pixel definition layer 300 is 89 nm, the thickness H2 of the organic light-emitting layer 400 is 333 nm.

Figure 13:
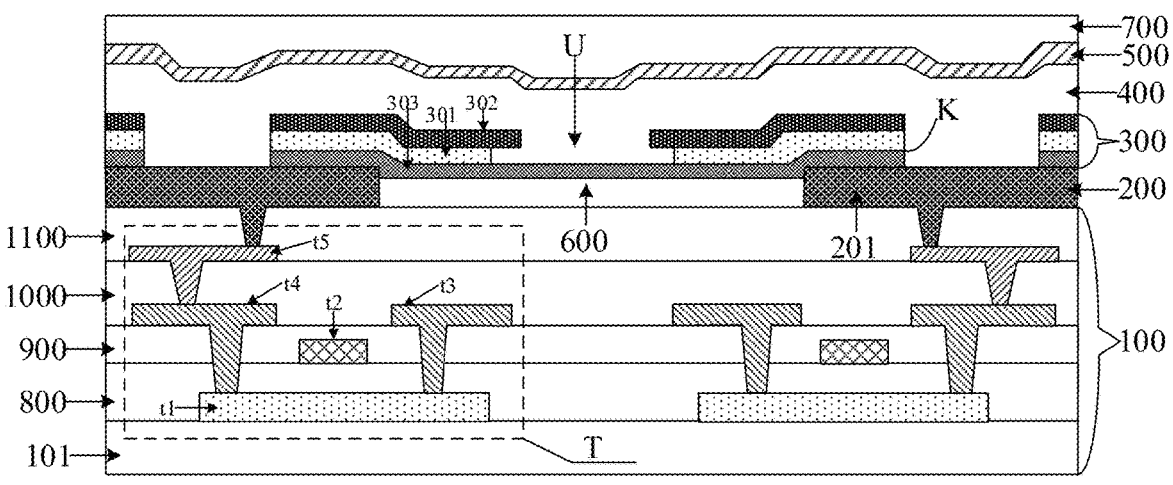
FIG. 13 is a schematic structural diagram of film layers of a display substrate according to some embodiments of the present disclosure.

In the embodiments of the present disclosure, referring to FIG. 13, FIG. 13 is a schematic structural diagram of film layers of a display substrate according to some embodiments of the present disclosure. The display substrate 000 further includes a packaging layer 700 disposed on one side, distal to the drive backplane 100, of the second electrode layer 500.

In the present disclosure, a plurality of pixel driver circuits T are provided in the drive backplane 100, and the plurality of pixel driver circuits T are all disposed on a substrate 101. Each of the pixel driver circuits T includes an active layer t1, a gate t2, a source t3, a drain t4, and a transfer electrode t5. Here, the plurality of pixel driver circuits T are electrically connected with the first electrodes 201 in the light-emitting devices in a one-to-one correspondence manner.

The active layer t1 is insulated from the gate t2 by a first gate insulating layer 800, and the active layer t1 is electrically connected with the source t3 and the drain t4. Typically, the source t3 and the drain t4 are arranged in the same layer. That is, the source t3 and the drain t4 are a portion of the same conductive pattern. The conductive pattern in which the source t3 and the drain t4 are disposed is insulated from the gate t2 by a second insulating layer 900.

It should be noted that the active layer t1, the gate t2, the source t3, and the drain t4 can constitute a thin-film transistor, and the embodiments of the present disclosure take the case where the thin-film transistor is a low-gate-type thin-film transistor as an example for illustrative description. In other optional implementations, the thin-film transistor may also be a top-gate-type thin-film transistor, which is not limited in the embodiments of the present disclosure.

One of the source t3 and the drain t4 in the drive backplane 100 is electrically connected to the first electrode 201 through the transfer electrode t5. Exemplarily, the transfer electrode t5 is insulated from the drain t4 by a third insulating layer 1000. Here, each pixel driver circuit T is electrically connected to the first electrode 201 in the light-emitting device corresponding to the pixel driver circuit T through the transfer electrode t5. Exemplarily, a first planarization layer 1100 is provided between the transfer electrode t5 and the first electrode layer 200.

The packaging layer 700 includes a first inorganic packaging layer, an organic packaging layer, and a second inorganic packaging layer, which are arranged in a stacked manner. The packaging layer 700 is configured to package the display substrate 000, so as to prevent the organic light-emitting layer 400 in the display substrate 000 from being corroded by moisture, oxygen, and other components in the air, resulting in damage. Thus, the service life of the light-emitting device is effectively prolonged by the packaging layer 700.

In summary, the display substrate according to the embodiments of the present disclosure includes a drive backplane, a first electrode layer, a pixel definition layer, an organic light-emitting layer, and a second electrode layer, wherein a partition groove is provided in the pixel definition layer. Since the portion of the organic material layer disposed inside the partition groove is separated from the portion of the organic material layer disposed outside the partition groove, the organic material layers between any adjacent light-emitting devices are separated by the partition groove. In this way, in the case that a voltage is applied to the first electrode, an electric field is formed between the first electrode and the second electrode layer, such that the leakage current generated by part of the organic material layers in each light-emitting device is separated by the partition groove. That is, the leakage current generated by the organic material layers in the light-emitting device is not horizontally directed to the organic material layer adjacent to this light-emitting device, and then the light emission of this light-emitting device does not affect the light emission of adjacent light-emitting devices. Thus, the better display effect in the display substrate can be ensured.

The embodiments of the present disclosure further provide a display device. The display device is any product or component with a display function, such as a mobile phone, a tablet computer, a television, a display, a notebook computer, a digital photo frame, and a navigator. The display device includes a driver chip and a display substrate. The display substrate is an OLED display substrate or an active matrix-organic light-emitting diode (AM-OLED) display substrate.

In the embodiments of the present disclosure, the display substrate is the display substrate in the above embodiments. For example, it may be the display substrate shown in FIG. 2, 4, 5, 6, 7, 9, 10, 11, or 13. The driver chip is connected to the display substrate and configured to provide an electrical signal for the display substrate, such that the display substrate can display an image.

It should be noted that, in the drawings, the sizes of the layers and areas may be exaggerated for clarity of illustration. Also, it can be understood that, in the case that an element or layer is referred to as being "on" another element or layer, it may be directly on the other element, or an intermediate layer may be present. In addition, it can be understood that, in the case that an element or layer is referred to as being "under" another element or layer, it may be directly under the other element, or one or more intermediate layers or elements may be present. In addition, it can also be understood that, in the case that a layer or element is referred to as being "between" two layers or elements, it may be the only layer between the two layers or elements, or one or more intermediate layers or elements may also be present. Like reference numerals refer to like elements throughout the present disclosure.

In the present disclosure, the terms "first" and "second" are merely used for descriptive purposes and should not be construed as indicating or implying the relative importance. The term "a plurality of" refers to two or more, unless otherwise explicitly defined.

Described above are merely optional embodiments of the present disclosure and are not intended to limit the present disclosure. Any modifications, equivalents, improvements, and the like, made within the spirit and principle of the present disclosure should fall within the protection scope of the present disclosure.

What is claimed is:

1. A display substrate, comprising:
a drive backplane;
a first electrode layer disposed on a side of the drive backplane, wherein the first electrode layer is provided with a plurality of first electrodes electrically connected to the drive backplane;
a pixel definition layer disposed on a side, distal to the drive backplane, of the first electrode layer, wherein the pixel definition layer is provided with a plurality of pixel opening holes in one-to-one correspondence with the plurality of first electrodes and a partition groove disposed between adjacent pixel opening holes, and at least a portion of each first electrode is disposed in the pixel opening hole corresponding to the first electrode;
an organic light-emitting layer disposed on a side, distal to the drive backplane, of the pixel definition layer, wherein the organic light-emitting layer comprises: a plurality of organic material layers stacked in a direction perpendicular to and away from the drive backplane, and a portion of the organic material layer disposed inside the partition groove is separated from a portion of the organic material layer disposed outside the partition groove; and
a second electrode layer disposed on a side, distal to the drive backplane, of the organic light-emitting layer;
wherein the display substrate further comprises an auxiliary support layer, wherein the auxiliary support layer and the first electrode layer are arranged on a same layer and are made of different materials, a thickness of the auxiliary support layer being less than or equal to a thickness of the first electrode layer;
wherein the orthographic projection of the partition groove onto the drive backplane falls within an orthographic projection of the auxiliary support layer onto the drive backplane; and
wherein the auxiliary support layer is provided with a plurality of hollow structures in one-to-one correspondence with the plurality of first electrodes, and outer boundaries of orthographic projections of the hollow structures onto the drive backplane are overlapped with outer boundaries of orthographic projections of the first electrodes onto the drive backplane.

2. The display substrate according to claim 1, wherein a recess structure is provided on a sidewall of the partition groove.

3. The display substrate according to claim 2, wherein the pixel definition layer comprises a first sub-definition layer and a second sub-definition layer stacked in the direction perpendicular to and away from the drive backplane, the partition groove extends through the first sub-definition layer and the second sub-definition layer, and a side, proximal to the partition groove, of the second sub-definition layer protrudes with respect to a side, proximal to the partition groove, of the first sub-definition layer.

4. The display substrate according to claim 3, wherein the partition groove comprises: a first sub-partition groove disposed in the first sub-definition layer and a second sub-partition groove disposed in the second sub-definition layer;
wherein an orthographic projection of the second sub-partition groove onto the drive backplane falls within an orthographic projection of the first sub-partition groove onto the drive backplane, and an outer boundary of the orthographic projection of the second sub-partition groove onto the drive backplane is not overlapped with an outer boundary of the orthographic projection of the first sub-partition groove onto the drive backplane.

5. The display substrate according to claim 4, wherein a distance between the outer boundary of the orthographic projection of the second sub-partition groove onto the drive backplane and the outer boundary of the orthographic projection of the first sub-partition groove onto the drive backplane ranges from 0.05 μm to 0.1 μm.

6. The display substrate according to claim 4, wherein the pixel definition layer further comprises: a third sub-definition layer disposed on a side, proximal to the drive backplane, of the first sub-definition layer;
wherein an orthographic projection of the partition groove onto the drive backplane falls within an orthographic projection of the third sub-definition layer onto the drive backplane;
or alternately, the partition groove further comprises: a third sub-partition groove disposed in the third sub-definition layer, an orthographic projection of the third sub-partition groove onto the drive backplane falls within the orthographic projection of the first sub-partition groove onto the drive backplane, and an outer boundary of the orthographic projection of the third sub-partition groove onto the drive backplane is not overlapped with the outer boundary of the orthographic projection of the first sub-partition groove onto the drive backplane.

7. The display substrate according to claim 6, wherein the first sub-definition layer is made of silicon nitride, and the second sub-definition layer and the third sub-definition layer are both made of silicon oxide.

8. The display substrate according to claim 7, wherein in a case that the orthographic projection of the partition groove onto the drive backplane falls within the orthographic projection of the third sub-definition layer onto the drive backplane, the pixel definition layer further comprises: a protection layer disposed between the third sub-definition layer and the first sub-definition layer, and the orthographic projection of the partition groove onto the drive backplane falls within an orthographic projection of the protection layer onto the backplane.

9. The display substrate according to claim 1, wherein an included angle between a sidewall of the partition groove and a side, proximal to the drive backplane, of the pixel definition layer ranges from 70° to 110°.

10. The display substrate according to claim 1, wherein the thickness of the auxiliary support layer is greater than or equal to half of the thickness of the first electrode layer.

11. The display substrate according to claim 1, wherein the partition groove is distributed around a periphery of each pixel opening hole.

12. The display substrate according to claim 1, wherein a depth of the partition groove ranges from 70 nm to 140 nm, and a minimum width of the partition groove ranges from 200 nm to 700 nm.

13. The display substrate according to claim 1, wherein an included angle between a sidewall of the pixel opening hole and a side, proximal to the drive backplane, of the pixel definition layer ranges from 70° to 90°.

14. The display substrate according to claim 1, wherein an orthographic projection of each pixel opening hole onto the drive backplane falls within the orthographic projection of the first electrode corresponding to the pixel opening hole onto the drive backplane.

15. The display substrate according to claim 14, wherein a distance between an outer boundary of the orthographic projection of each pixel opening hole onto the drive backplane and an outer boundary of the orthographic projection of the first electrode corresponding to the pixel opening hole onto the drive backplane is greater than or equal to 150 nm.

16. The display substrate according to claim 1, wherein a thickness of the organic light-emitting layer is greater than or equal to three times a thickness of the pixel definition layer.

17. The display substrate according to claim 1, wherein the display substrate further comprises a packaging layer disposed on a side, distal to the drive backplane, of the second electrode layer.

18. A display device, comprising: a driver chip and a display substrate, wherein the display substrate comprises:

a drive backplane;

a first electrode layer disposed on a side of the drive backplane, wherein the first electrode layer is provided with a plurality of first electrodes electrically connected to the drive backplane;

a pixel definition layer disposed on a side, distal to the drive backplane, of the first electrode layer, wherein the pixel definition layer is provided with a plurality of pixel opening holes in one-to-one correspondence with the plurality of first electrodes and a partition groove disposed between adjacent pixel opening holes, and at least a portion of each first electrode is disposed in the pixel opening hole corresponding to the first electrode;

an organic light-emitting layer disposed on a side, distal to the drive backplane, of the pixel definition layer, wherein the organic light-emitting layer comprises: a plurality of organic material layers stacked in a direction perpendicular to and away from the drive backplane, and a portion of the organic material layer disposed inside the partition groove is separated from a portion of the organic material layer disposed outside the partition groove; and a second electrode layer disposed on a side, distal to the drive backplane, of the organic light-emitting layer; and the driver chip is configured to apply a control signal to the display substrate;

wherein the display substrate further comprises an auxiliary support layer, wherein the auxiliary support layer and the first electrode layer are arranged on a same layer and are made of different materials, a thickness of the auxiliary support layer being less than or equal to a thickness of the first electrode layer;

wherein the orthographic projection of the partition groove onto the drive backplane falls within an orthographic projection of the auxiliary support layer onto the drive backplane; and wherein the auxiliary support layer is provided with a plurality of hollow structures in one-to-one correspondence with the plurality of first electrodes, and outer boundaries of orthographic projections of the hollow structures onto the drive backplane are overlapped with outer boundaries of orthographic projections of the first electrodes onto the drive backplane.

* * * * *